(12) United States Patent
Rosenberg et al.

(10) Patent No.: US 9,971,088 B2
(45) Date of Patent: May 15, 2018

(54) INTEGRATED OPTICAL SUB-ASSEMBLY

(75) Inventors: Paul Kessler Rosenberg, Sunnyvale, CA (US); Michael Renne Ty Tan, Menlo Park, CA (US); Sagi Varghese Mathai, Sunnyvale, CA (US); Joseph Straznicky, Santa Rosa, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days. days.

(21) Appl. No.: 14/390,587

(22) PCT Filed: Apr. 16, 2012

(86) PCT No.: PCT/US2012/033798
§ 371 (c)(1),
(2), (4) Date: Oct. 3, 2014

(87) PCT Pub. No.: WO2013/158068
PCT Pub. Date: Oct. 24, 2013

(65) Prior Publication Data
US 2015/0131940 A1     May 14, 2015

(51) Int. Cl.
*G02B 6/12* (2006.01)
*G02B 6/42* (2006.01)
*H01L 21/02* (2006.01)

(52) U.S. Cl.
CPC .............. *G02B 6/12* (2013.01); *G02B 6/424* (2013.01); *G02B 6/425* (2013.01); *G02B 6/4245* (2013.01); *G02B 6/4259* (2013.01); *G02B 6/4274* (2013.01); *G02B 6/4279* (2013.01);
(Continued)

(58) Field of Classification Search
CPC ...... G02B 6/12; G02B 6/4295; G02B 6/4296; G02B 6/4274; H01L 21/02; H04B 10/801
See application file for complete search history.

(56) References Cited

U.S. PATENT DOCUMENTS 5,416,872 A * 5/1995 Sizer, II ............... G02B 6/4202
                                                      385/88
6,169,833 B1 * 1/2001 Goossen ............... G02B 6/423
                                                      385/14
(Continued)

FOREIGN PATENT DOCUMENTS

CN          101075007 A     11/2007
EP            1429166 A1     6/2004
(Continued)

OTHER PUBLICATIONS

PCT International Search Report & Written Opinion, dated Dec. 26, 2012, PCT Patent Application No. PCT/US2012/033798, 9 pages.
(Continued)

*Primary Examiner* — Thomas A Hollweg
*Assistant Examiner* — Guy Anderson
(74) *Attorney, Agent, or Firm* — Michael A. Dryja (57) ABSTRACT

An optical subassembly includes a thru optical via (104) formed through a semiconductor substrate (102), an optoelectronic component (108) secured to the substrate (102) such that an active region (106) of the optoelectronic component is aligned with the thru optical via (104), and circuitry (110) formed into the substrate (102), the circuitry to connect to and operate in accordance with the optoelectronic component (108).

18 Claims, 5 Drawing Sheets

(52) U.S. Cl.
CPC ............ *G02B 6/4295* (2013.01); *H01L 21/02* (2013.01); *Y10T 29/41* (2015.01)

(56) References Cited

U.S. PATENT DOCUMENTS

| | | | |
|---|---|---|---|
| 6,267,515 B1* | 7/2001 | Okuda | G02B 6/4206 385/88 |
| 6,315,465 B1* | 11/2001 | Mizue | G02B 6/4201 385/94 |
| 6,623,178 B1 | 9/2003 | Sakurai et al. | |
| 6,626,585 B1* | 9/2003 | Malone | G02B 6/423 385/88 |
| 6,792,171 B2 | 9/2004 | Hargis et al. | |
| 6,824,313 B2 | 11/2004 | Kuhara et al. | |
| 6,900,509 B2* | 5/2005 | Gallup | G02B 6/4201 257/21 |
| 6,910,812 B2* | 6/2005 | Pommer | G02B 6/4201 257/200 |
| 6,981,804 B2* | 1/2006 | Jian | G02B 6/423 385/88 |
| 7,440,647 B2* | 10/2008 | Hosking | H04B 10/40 385/12 |
| 7,496,251 B2 | 2/2009 | Coohen et al. | |
| 7,654,753 B2 | 2/2010 | Sheau Tung Wong et al. | |
| 7,838,898 B2* | 11/2010 | Park | H05K 1/0206 257/13 |
| 8,004,080 B2* | 8/2011 | McShane | H01L 24/13 257/432 |
| 8,265,432 B2* | 9/2012 | Doany | G02B 6/4201 257/432 |
| 8,399,292 B2* | 3/2013 | Doany | G02B 6/4246 438/106 |
| 8,412,052 B2* | 4/2013 | Mohammed | G02B 6/4249 385/52 |
| 8,488,921 B2* | 7/2013 | Doany | G02B 6/02042 257/200 |
| 8,536,610 B2* | 9/2013 | Doany | G02B 6/4246 257/79 |
| 8,692,276 B2* | 4/2014 | Doany | G02B 6/4246 257/79 |
| 2002/0021871 A1 | 2/2002 | Auburger et al. | |
| 2003/0122079 A1* | 7/2003 | Pobanz | H01L 27/14649 250/336.1 |
| 2003/0218666 A1* | 11/2003 | Holm | H01L 25/0753 347/130 |
| 2004/0109627 A1 | 6/2004 | Kim et al. | |
| 2006/0088254 A1* | 4/2006 | Mohammed | G02B 6/4249 385/92 |
| 2009/0226130 A1* | 9/2009 | Doany | G02B 6/4201 385/14 |
| 2009/0297103 A1 | 12/2009 | Wong et al. | |
| 2009/0323748 A1 | 12/2009 | Nobuhara | |
| 2011/0044369 A1* | 2/2011 | Andry | G02B 6/4204 372/50.124 |
| 2012/0001166 A1* | 1/2012 | Doany | G02B 6/4246 257/43 |
| 2012/0014639 A1 | 1/2012 | Doany et al. | |
| 2013/0142211 A1* | 6/2013 | Doany | G02B 6/4246 372/50.12 |
| 2013/0308900 A1* | 11/2013 | Doany | G02B 6/4246 385/14 |

FOREIGN PATENT DOCUMENTS

| | | |
|---|---|---|
| EP | 1542291 A1 | 6/2005 |
| JP | 2004047831 | 2/2004 |

OTHER PUBLICATIONS

Extended European Search Report received in EP Application No. 12874816.7, Nov. 17, 2015, 7 pages.
International Preliminary Report on Patentability received in PCT Application No. PCT/US2012/033798, dated Oct. 30, 2014, 6 pages.

* cited by examiner

INTEGRATED OPTICAL SUB-ASSEMBLY

BACKGROUND

Optical engines are commonly used to transfer electronic data at high rates of speed. An optical engine includes hardware for transferring an electrical signal to an optical signal, transmitting that optical signal, receiving the optical signal, and transforming that optical signal back into an electrical signal. The electrical signal is transformed into an optical signal when the electrical signal is used to modulate an optical source device such as a laser. The light from the source is then coupled into an optical transmission medium such as an optical fiber. After traversing an optical network through various optical transmission media and reaching its destination, the light is coupled into a receiving device such as a detector. The detector then produces an electrical signal based on the received optical signal for use by digital processing circuitry.

Optical communication systems are often used to transmit data in a variety of systems such as telecommunication systems and data communication systems. Telecommunication systems often involve the transmission of data over large geographic distances ranging from a few miles to thousands of miles. Data communications often involve transmission of data throughout a datacenter. Such systems involve the transmission of data over distances ranging from a few meters to several hundred meters. The coupling components that are used to transfer an electrical signal into an optical signal and put that optical signal into an optical transmission medium such as a fiber optic cable are relatively costly. Due to this expense, optical transmission systems are generally used as a backbone of a network to transfer large amounts of data over greater distances.

BRIEF DESCRIPTION OF THE DRAWINGS

The accompanying drawings illustrate various examples of the principles described herein and are a part of the specification. The illustrated examples are merely examples and do not limit the scope of the claims.

Throughout the drawings, identical reference numbers designate similar, but not necessarily identical, elements.

DETAILED DESCRIPTION

As mentioned above, due to the expense of the components that convert electrical signals into optical signals and vice versa, optical communication systems are typically used as a backbone in networks. However, optical systems can provide various benefits to computer communications. Computer communications refers to those that range from a few centimeters to a few hundred centimeters. Using optical engines in computer communications has not become common due to the cost and size of such systems.

In light of this issue, the present specification discloses methods and systems for making optical systems more amenable to computer communications. Optical systems can make use of a semiconductor bench that connects an optical transmission medium to an optoelectronic component. An optoelectronic component is either a light emitting device or a light receiving device. An example of a light emitting device is a Vertical Cavity Surface Emitting Laser (VCSEL). An example of a light receiving device is a photodiode.

A thru optical via is formed through the bench substrate. Various alignment techniques are used to secure the optoelectronic component to one side of the semiconductor bench so that active regions of the optoelectronic component are aligned with the thru optical vias. An active region is the part of the optoelectronic component that actually emits or receives light. Circuitry is used to operate in accordance with the optical component. For example, a photodiode operates with a trans-impedance amplifier to amplify the electrical signals resulting from the impingement of photons on the photodiode. In the case that the optoelectronic component is a light emitting device, circuitry is used to drive that device.

The present specification discloses methods and systems for forming the circuitry that operates in accordance with the optoelectronic component directly onto the semiconductor substrate that bridges the optoelectronic component and the optical transmission medium. By having the circuitry formed within the semiconductor substrate removes the use of a separate chip to hold that circuitry. This allows for a smaller and less costly optical transmission system.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples. The various instances of the phrase "in one example" or similar phrases in various places in the specification are not necessarily all referring to the same example.

Throughout this specification and in the appended claims, the term "optoelectronic component" refers to either an optical source device such as a laser or an optical receiver device such as a detector. Additionally, the term "active region" refers to the actual part of the optoelectronic component that emits light or senses light. For example, in the case that the optoelectronic component is a source device, then the active region is the actual component which is emitting light. In the case that the optoelectronic component is a receiver device, the active region is the actual component where light received is impinged upon. Furthermore, the term "light" refers to any type of electromagnetic radiation.

Figure 1:
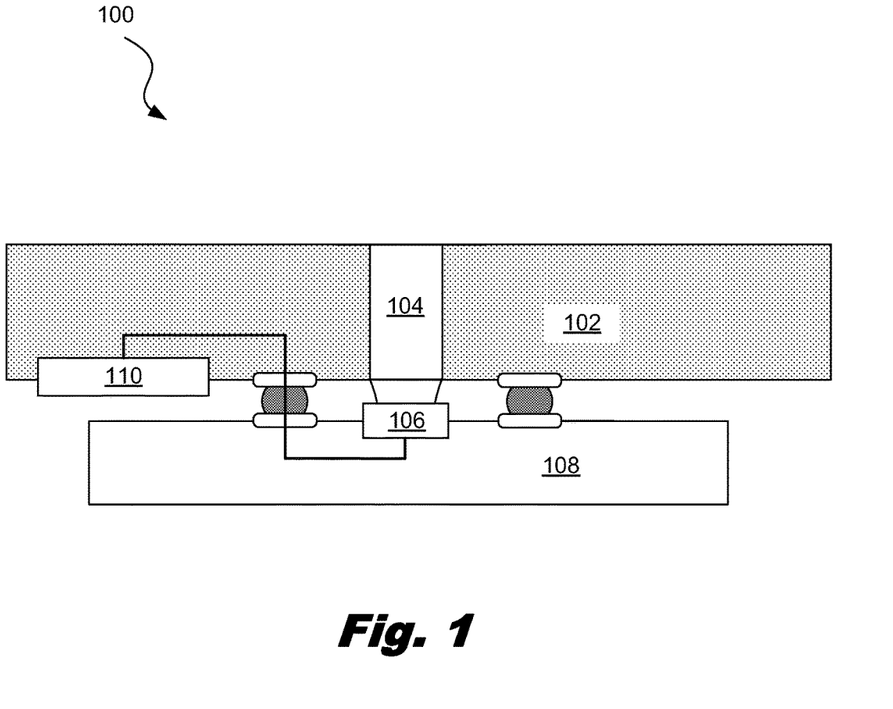
FIG. 1 is a diagram showing an illustrative integrated optical sub-assembly, according to one example of principles described herein.

Referring now to the figures, FIG. 1 is a diagram showing an illustrative integrated optical sub-assembly (100). According to certain illustrative examples, the optical sub-assembly (100) includes a semiconductor bench substrate (102). A thru optical via (104) is formed through that semiconductor substrate (102). An optoelectronic component (108) is secured to the semiconductor substrate (102) through a securing mechanism. The optoelectronic component (108) is aligned such that an active region (106) of the optoelectronic component (108) is aligned with the thru optical via (104). Additionally, circuitry (110) is formed within the semiconductor substrate (102) and is connected to the optoelectronic component (108).

The semiconductor substrate (102) is made of a semiconductor material such as silicon. The main function of the semiconductor substrate is to couple the optoelectronic component (108) and an optical transmission medium (not shown). Semiconductor materials are also used to form integrated circuits. Thus, electronic components such as transistors, capacitors, and resistors can be formed into the semiconductor substrate to form an integrated circuit. This integrated circuitry (110) can be used to operate with the optoelectronic component (108).

The thru optical via (104) formed through the semiconductor substrate (102) is used to direct light between the active region (106) of the optoelectronic component (108) and the optical transmission medium. The thru optical via may be designed to act as a waveguide, allowing light to propagate through by bouncing off the walls. Alternatively, the thru optical via may be designed to let light directly though without bouncing off of the walls.

The method of securing the optoelectronic component (108) to the semiconductor substrate (102) may be a solder reflow process. In such a process, a set of metal pads are formed onto the semiconductor substrate (102). A corresponding set of metal pads are formed onto the optoelectronic component (108). A solder bump is then placed onto one of the sets of pads. At this point the solder bumps are not yet completely melted. Rather they are in a state so as to stick to the bond pads. With the application of an appropriate amount of heat, the solder bumps will completely melt. The size, shape, and material of the bond pads and the size, shape, and material of the solder bumps are such that the surface tension will bring the semiconductor substrate (102) bond pads into alignment with the optoelectronic component (108) bond pads.

Electrical signals are able to pass through the solder bump securing mechanism. Thus, the circuitry used to operate the optoelectronic component can be formed within the semiconductor substrate (102). For example, the electrical signals output by a photodiode are often amplified before being sent to further digital processing circuitry. Trans-impedance amplifiers can be used to perform this amplification process. These trans-impedance amplifiers are formed into the semiconductor bench substrate rather than the optoelectronic component chip itself. The trans-impedance amplifier can then be connected to the photodiode through the solder bumps used to secure the photodiode to the semiconductor substrate (102).

Figure 2:
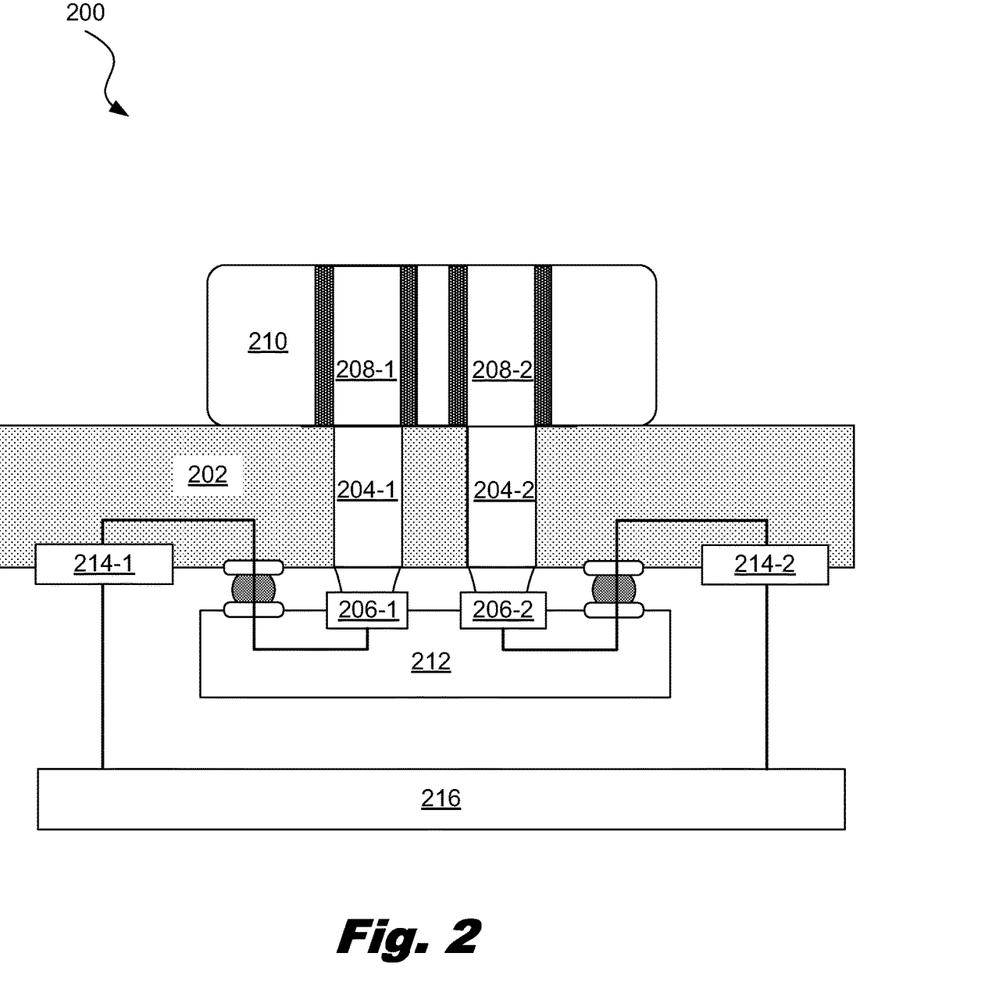
FIG. 2 is a diagram showing an illustrative integrated optical sub-assembly with multiple channels, according to one example of principles described herein.

FIG. 2 is a diagram showing an illustrative integrated optical sub-assembly (200) with multiple channels. A typical optical transmission medium propagates multiple channels of data. According to certain illustrative examples, the semiconductor substrate (202) may include a thru optical via (204) for each channel. While only two thru optical vias are illustrated in FIG. 2, a practical semiconductor substrate may have a larger number of thru-optical vias (204). The optoelectronic component (212) includes a corresponding number of active regions (206), one for each thru optical via (204). The positioning of the active regions (206) precisely matches the positioning of the thru optical vias (204).

The optical connector (210) which holds the optical transmission media (208) may be secured to the opposite side of the semiconductor substrate (202) through a variety of methods. One example of an optical transmission medium is an optical fiber. The optical connector (210) positions the optical fibers so that they are aligned with the thru optical vias (204). Thus, each optical fiber (208) propagates a different channel of data into its respective thru optical via (204).

Each active region (206) that receive or emits an optical signal can be connected to its own circuitry block (214) formed into the semiconductor substrate (202). In the case that the optoelectronic component (212) is a light receiving device, a first optical via (204-1) propagates a first optical signal from a first optical transmission medium (208-1) to a first photodiode (206-1). That photodiode (206-1) is connected to a trans-impedance amplifier circuitry block (214-1) on the semiconductor substrate (202).

Likewise, a second optical via (204-2) propagates a second optical signal from a second optical transmission medium (208-2) to a second photodiode (206-2). That photodiode (206-2) is connected to a different trans-impedance amplifier circuitry block (214-2) on the semiconductor substrate (202). The trans-impedance amplifier circuitry blocks (214) may then pass the amplified signal on for further processing. For example, the trans-impedance amplifier circuitry blocks (214) may be connected to processing module (216) such as a Serial-Deserializer (SerDes). Alternatively, the SerDes may be integrated onto the substrate (202). In some examples, the substrate (202) may be an Application Specific Integrated Circuit (ASIC).

Figure 3A:
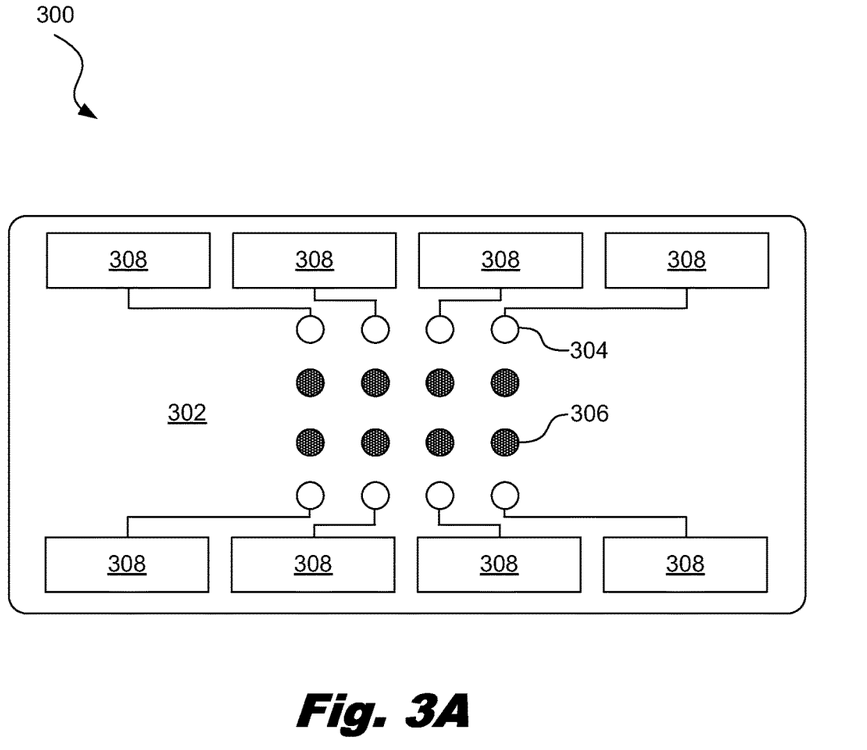
FIG. 3A is a diagram showing an illustrative top view of a semiconductor substrate having circuitry formed thereon, according to one example of principles described herein.

FIG. 3A is a diagram showing an illustrative top view (300) of a semiconductor substrate having circuitry formed thereon. According to certain illustrative examples, an array of thru optical vias (306) is formed into the semiconductor substrate (302). For each thru optical via (306), there is a corresponding metal pad (304) to be used in the solder reflow process that secures the optoelectronic component to the semiconductor substrate (302). The semiconductor substrate (302) is formed such that electrical traces run from each of the metal pads (304) to a circuitry block (308).

Figure 3B:
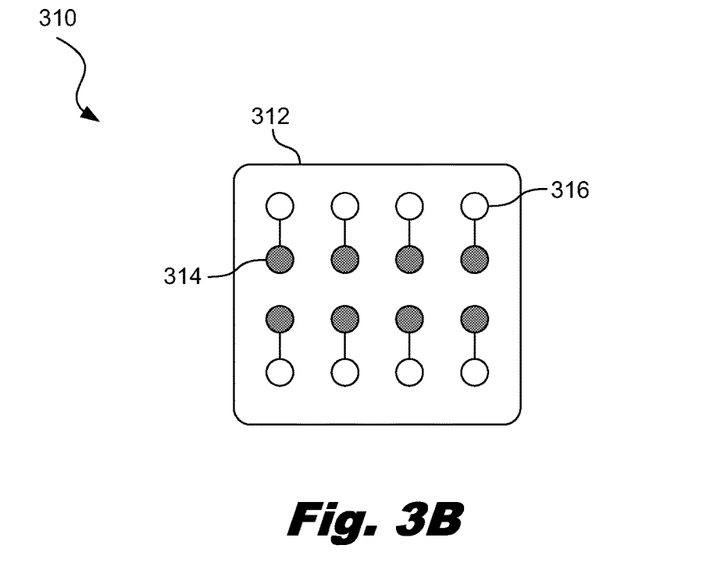
FIG. 3B is a diagram showing an illustrative top view of an optoelectronic component to be aligned to the semiconductor substrate of FIG. 3A, according to one example of principles described herein.

FIG. 3B is a diagram showing an illustrative top view (310) of an optoelectronic component (312) to be aligned to the semiconductor substrate of FIG. 3A. According to certain illustrative examples, the optoelectronic component (312) includes an array of active regions (314). These active regions correspond to the thru optical vias (306) of the semiconductor substrate (302). Additionally, each active region (314) is electrically connected to a set of metal pads (316) formed onto the optoelectronic component. This set of metal pads corresponds to the set of metal pads (304) on the semiconductor substrate (302).

When the optoelectronic component (312) is secured to the semiconductor substrate (302), the active regions (314) become electrically connected to the circuitry blocks (308) through the solder bumps. For example, in the case that the optoelectronic component is a receiving device, the active regions of the photodiodes will receive an electrical signal in response to light impinging on those photodiodes from the thru optical vias (306). These electrical signals will then travel through the traces on the optoelectronic component, through the solder bumps, and through the traces on the semiconductor substrate (302) to the trans-impedance amplifier circuitry blocks (308).

In the case that the optoelectronic component (312) is a light emitting device, the active regions of the VCSELs will receive an electrical signal from the circuitry blocks (308)

through the traces on the semiconductor substrate (302), through the solder bumps, and through the traces on the optoelectronic component (312). The circuitry blocks (308) in this case may be used to drive the electrical signal sent to the VCSELs to appropriately modulate the VCSEL.

Figure 4:
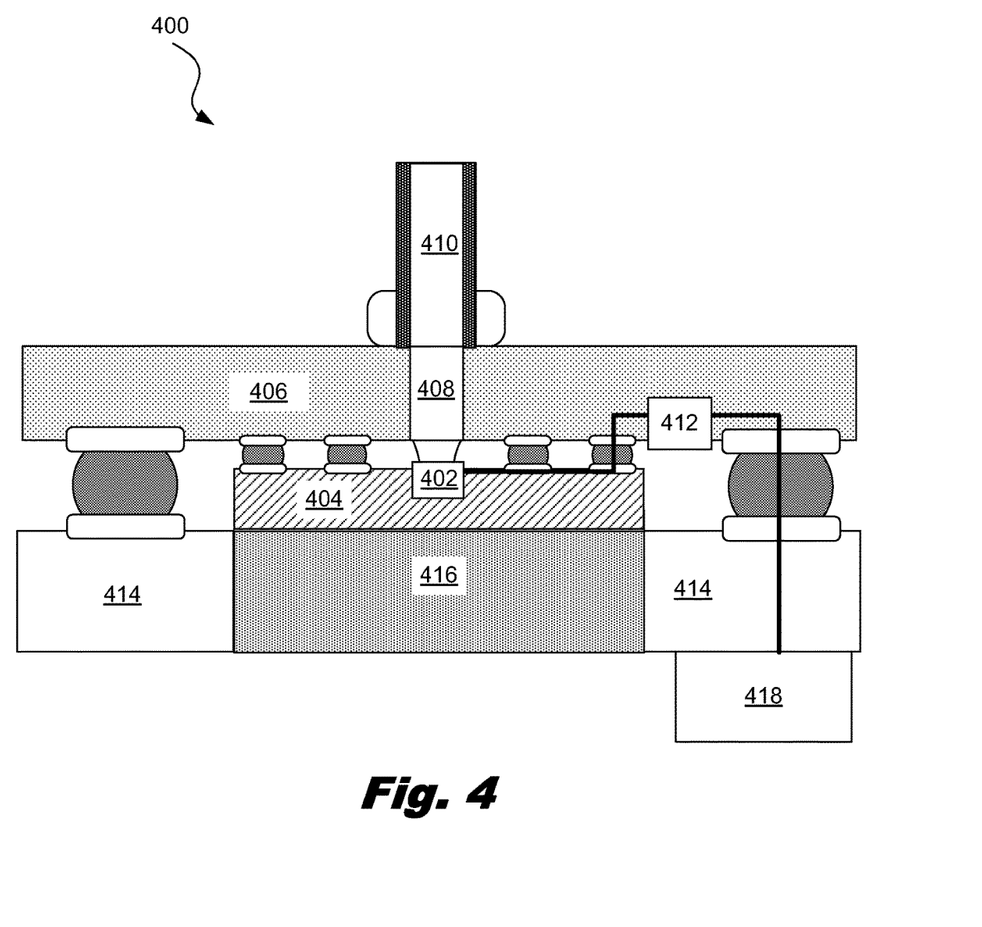
FIG. 4 is a diagram showing an illustrative integrated optical sub-assembly connected to a printed circuit board, according to one example of principles described herein.

FIG. 4 is a diagram showing an illustrative integrated optical sub-assembly (400) connected to a printed circuit board (414). As mentioned above, optical engines are used to transfer electrical signals into optical signals before transmission over an optical medium. Upon arriving at the destination, the optical signal is transformed back into an electrical signal. The electrical signal is typically processed by a processing module before being transformed into an optical signal. A processing module (418) on the transmission end includes the hardware (i.e. a laser driver integrated circuit) that formats an electrical signal for transformation into an optical signal. Additionally, a processing module (418) on the receiving end (i.e. a receiver integrated circuit) formats the detected optical signal back into a format to be used by standard digital processing circuitry.

In one example, the printed circuit board (414) may fit around a heat sink material (416) used to support the optoelectronic component (404). In the case that the optoelectronic component (404) is a light detecting device, the electrical signal created from the detected optical signal can be sent through the bond pads, along the semiconductor substrate (406) to the circuitry block (412) formed within the semiconductor substrate (406). This circuitry block (412) may be an amplifier circuit to amplify the electrical signals from the photodiodes of the optoelectronic component (404). After being amplified by the circuitry block (412), the amplified signal may be passed through a different set of bond pads used to connect the semiconductor substrate to the printed circuit board (414). The printed circuit board may include further processing modules (418) such as a SerDes.

In the case that the optoelectronic component (404) is a light emitting device, the processing module (418) may send an electrical signal through the bond pads securing the printed circuit board (418) to the semiconductor substrate (406) to the circuitry block (412). The driver circuitry within the circuitry block (412) is then used to modulate the VCSELs of the optoelectronic component (404). This may be done by sending the appropriate electrical signal from the circuitry block (412) through the bond pads connecting the optoelectronic component (404) to the semiconductor substrate (406). The active region of the VCSELs will then project the modulated light through the corresponding thru optical via (408) and into the optical transmission medium.

Figure 5:
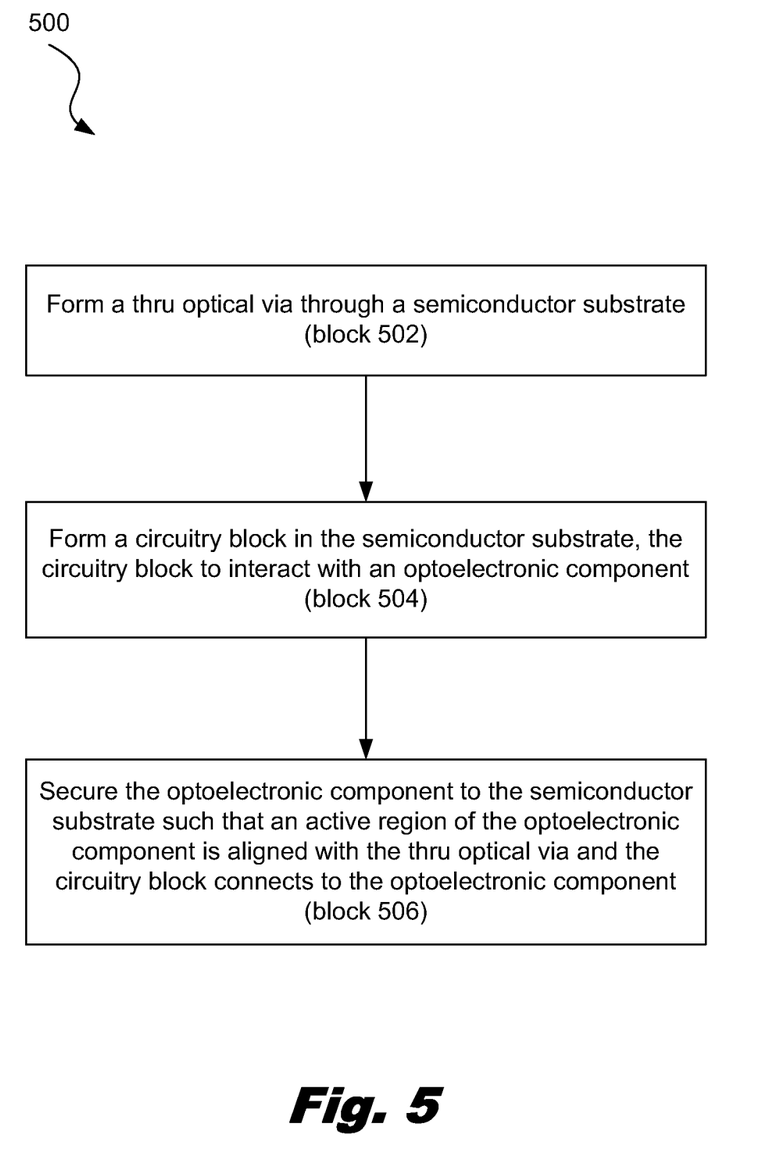
FIG. 5 is a flowchart showing an illustrative method for forming an integrated optical sub-assembly, according to one example of principles described herein.

FIG. 5 is a flowchart showing an illustrative method (500) for forming an integrated optical sub-assembly. According to certain illustrative examples, the method includes forming (block 502) a thru optical via through a semiconductor substrate and forming (block 504) a circuitry block in the semiconductor substrate. The circuitry block is to interact with an optoelectronic component. The method further includes securing (block 506) the optoelectronic component to the semiconductor substrate such that an active region of the optoelectronic component is aligned with the thru optical via and the circuitry block connects to the optoelectronic component.

In conclusion, the present specification discloses methods and systems for forming the circuitry that operates in accordance with the optoelectronic component directly onto the semiconductor substrate that bridges the optoelectronic component and the optical transmission medium. By having the circuitry formed within the semiconductor substrate removes the use of a separate chip to hold that circuitry. This allows for a smaller and less costly optical transmission system.

The preceding description has been presented only to illustrate and describe examples of the principles described. This description is not intended to be exhaustive or to limit these principles to any precise form disclosed. Many modifications and variations are possible in light of the above teaching.

What is claimed is:

1. An optical assembly comprising:
   a heat sink;
   a printed circuit board disposed around the heat sink;
   a semiconductor substrate;
   a thru optical via formed completely through the semiconductor substrate;
   an optoelectronic component supported by the heat sink and having an active region;
   a securing mechanism including conductive pads formed on the semiconductor substrate, conductive pads formed on the optoelectronic component, and conductive material to secure said optoelectronic component to said substrate, the size, shape, and material of the conductive pads and conductive material to provide tension to align the active region of said optoelectronic component with said thru optical via;
   circuitry formed within said substrate, said circuitry to electrically connect to said optoelectronic component through the securing mechanism and amplify electrical signals from said optoelectronic component;
   a driver circuit disposed on an underside of the printed circuit board and conductively connected to the circuitry; and
   optical transmission media optically coupled to the thru optical via.

2. The assembly of claim 1, wherein said optoelectronic component comprises a light receiving device.

3. The assembly of claim 2, wherein said circuitry comprises a trans-impedance amplifier to amplify the electrical signals from said light receiving device.

4. The assembly of claim 1, wherein said optoelectronic component comprises a light emitting component.

5. The assembly of claim 4, wherein said circuitry is to drive said light emitting component.

6. The assembly of claim 1, wherein said circuitry is connected to digital circuitry not formed within said substrate through the securing mechanism.

7. A method of forming an optical assembly comprising:
   providing a circuit board fitted around a heat sink;
   mounting an optoelectronic component to the heat sink;
   forming a thru optical via completely through a semiconductor substrate;
   forming a circuitry block within said semiconductor substrate, said circuitry block to amplify electrical signals from the optoelectronic component;
   forming conductive pads on the semiconductor substrate;
   forming conductive pads on the optoelectronic component;
   securing, with conductive material between corresponding conductive pads on the semiconductor substrate and on the optoelectronic component, said optoelectronic component to said semiconductor substrate;
   aligning, via tension between the conductive pads and the conductive material, an active region of said optoelectronic component with said thru optical via, the tension controlled by the size, shape, and material of the conductive pads and conductive material;

electrically connecting, with the conductive pads and conductive material, said circuitry block to said optoelectronic component;

disposing a driver circuit on the printed circuit board;

conductively connecting the driver circuit to the circuitry block; and optically coupling optical transmission media to the thru optical via.

8. The method of claim 7, wherein said optoelectronic component comprises a light receiving device.

9. The method of claim 8, wherein said circuitry block comprises a trans-impedance amplifier to amplify the electrical signals from said light receiving device.

10. The method of claim 7, wherein said optoelectronic component comprises a light emitting component.

11. The method of claim 10, wherein said circuitry block is to drive said light emitting component.

12. The method of claim 7, wherein said circuitry block is connected to said optoelectronic component through a securing mechanism used to secure said optoelectronic component to said substrate.

13. The method of claim 7, wherein said circuitry block is connected to digital circuitry not formed within said substrate through a securing mechanism.

14. An optical assembly comprising:

a heat sink;

a printed circuit board disposed around the heat sink;

a semiconductor substrate;

an array of thru optical vias formed completely through the semiconductor substrate;

an optoelectronic component supported by the heat sink and having an array of active regions corresponding with said array of thru optical vias;

a securing mechanism including conductive pads formed on the semiconductor substrate, conductive pads formed on the optoelectronic component, and conductive material to secure said optoelectronic component to said substrate, the size, shape, and material of the conductive pads and conductive material to provide tension to align said array of active regions with said array of thru optical vias;

an array of circuitry blocks formed within said substrate, one circuitry block for each of said active regions, said circuitry blocks to electrically connect to said optoelectronic component through the securing mechanism and amplify electrical signals from said optoelectronic component;

a driver circuit disposed on an underside of the printed circuit board and conductively connected to the circuitry blocks; and optical transmission media optically coupled to the optical vias.

15. The optical assembly of claim 14, wherein said optoelectronic component comprises light receiving devices.

16. The optical assembly of claim 14, wherein said array of circuitry blocks comprises trans-impedance amplifiers to amplify electrical signals from said light receiving devices.

17. The optical assembly of claim 14, wherein said optoelectronic component comprises light emitting components.

18. The optical assembly of claim 14, wherein said array of circuitry blocks is to drive said light emitting components.

* * * * *